United States Patent
Cheng et al.

(10) Patent No.: US 7,375,787 B2
(45) Date of Patent: May 20, 2008

(54) LIQUID CRYSTAL DISPLAY DEVICES

(75) Inventors: Ping-Chin Cheng, Yingge Township, Taipei County (TW); Hui-Chang Chen, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 11/544,409

(22) Filed: Oct. 5, 2006

(65) Prior Publication Data

US 2007/0030435 A1    Feb. 8, 2007

Related U.S. Application Data

(62) Division of application No. 10/766,536, filed on Jan. 27, 2004, now Pat. No. 7,139,060.

(51) Int. Cl.
*G02F 1/1345*    (2006.01)

(52) U.S. Cl. ...................................... 349/151
(58) Field of Classification Search ......... 349/149–152
See application file for complete search history.

(56) References Cited

U.S. PATENT DOCUMENTS

| 5,963,287 A | 10/1999 | Asada et al. |
| 6,265,770 B1 | 7/2001 | Uchiyama |
| 6,590,629 B1 * | 7/2003 | Hirobe et al. ............... 349/149 |
| 7,262,827 B2 * | 8/2007 | Yoo et al. ................... 349/150 |

FOREIGN PATENT DOCUMENTS

| CN | 1235375 A | 3/1999 |
| CN | 1235375 A | 11/1999 |
| JP | 11064881 | 3/1999 |
| JP | 11-195866 | 7/1999 |
| JP | 2000183112 | 6/2000 |
| TW | 476122 | 2/2002 |

* cited by examiner

Primary Examiner—James A Dudek
(74) Attorney, Agent, or Firm—Duane Morris, LLP

(57) ABSTRACT

A liquid crystal display device includes a thin film transistor array disposed on a first region of a panel. An anisotropic conductive film bonds at least one integrated circuit chip and at least one other device, such as a FPC board, a TCP and a COF, to a second region of the panel.

6 Claims, 6 Drawing Sheets

LIQUID CRYSTAL DISPLAY DEVICES

RELATED APPLICATION

This application is a divisional application of Ser. No. 10/766,536 filed Jan. 27, 2004 now U.S. Pat. No. 7,139,060, the contents of which are hereby incorporated by reference, as if set forth in their entirety and upon which priority is claimed.

FIELD OF THE INVENTION

This invention relates to liquid crystal display (LCD) panels and LCD devices.

BACKGROUND OF THE INVENTION

Flat panel display devices commonly use LCD panels. An LCD panel may include a pixel region having an array of pixel thin film transistors and intersecting arrays of spaced apart data lines and gate lines that are connected to the array of pixel thin film transistors. The array of pixel thin film transistors, data lines and gate lines form an array of addressable pixels. The LCD panel may also include a peripheral region having driver integrated circuit (IC) chips mounted therein, which drive the array of pixel thin film transistors. The peripheral region may also connect flexible printed circuit (FPC) boards, tape carrier packages (TCPs) and/or chip-on-film (COF) devices.

The driver IC chips may be mounted to the LCD panel in the peripheral region thereof using a chip-on-glass (COG) technology. In COG, anisotropic conductive films (ACFs) are used to bond the driver IC chips. ACFs are also used for connecting the FPC boards, TCPs, or COFs to the LCD panel.

The driver IC chips and the FPC board/TCP/COF devices are presently bonded to the panel in a multiple ACF bonding process or method. In the first step of the method, a first ACF adapted specifically for bonding the driver IC chip is applied to the LCD panel and then the IC chip is bonded to the panel, via the first ACF, using ACF bonding parameters specific to the IC chip. In the second step of the process, a second ACF adapted specifically for bonding the FPC board/TCP/COF device is applied to the LCD panel and then the FPC board/TCP/COF device is bonded to the panel, via the second ACF, using ACF bonding parameters specific to the FPC board/TCP/COF device.

The double ACF bonding method has a relatively high cost in terms of time, materials, and equipment. Further, the two different ACF types require separate classifications to ensure proper production line control.

SUMMARY OF THE INVENTION

A liquid crystal display device includes a thin film transistor array disposed on a first region of a panel. An anisotropic conductive film bonds at least one integrated circuit chip and at least one other device, such as a flexible printed circuit board, a tape carrier package, and a chip-on-film, to a second region of the panel.

DETAILED DESCRIPTION OF THE INVENTION

An anisotropic conductive film (ACF) bonding method is described herein for ACF bonding a driver integrated circuit (IC) chip and a flexible printed circuit (FPC) board, a tape carrier package (TCP), or a chip-on-film (COF) to a liquid-crystal-display (LCD) panel of a LCD device, using a single, unitary ACF. The bonding method simplifies the LCD panel and device manufacturing process, improves quantity of output and yield, and reduces M/C cost. For purposes of clarity only, the bonding method will be described below as it applies to a driver IC chip or chips and a FPC board. As mentioned above, the method is also applicable to the bonding of IC chip or chips and TCPs or COFs.

Figure 1A:
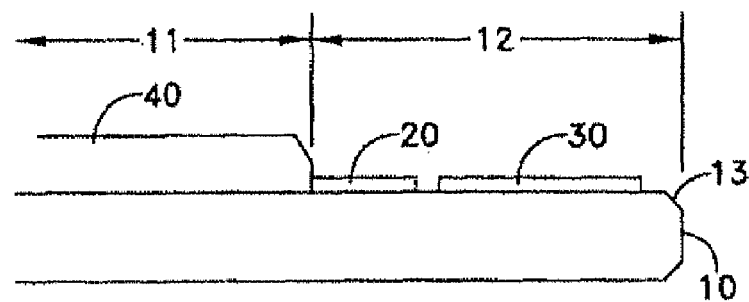
FIGS. 1A-1C are side elevational views of a section of a liquid crystal display panel illustrating an embodiment of the method of the invention.
Figure 2A:
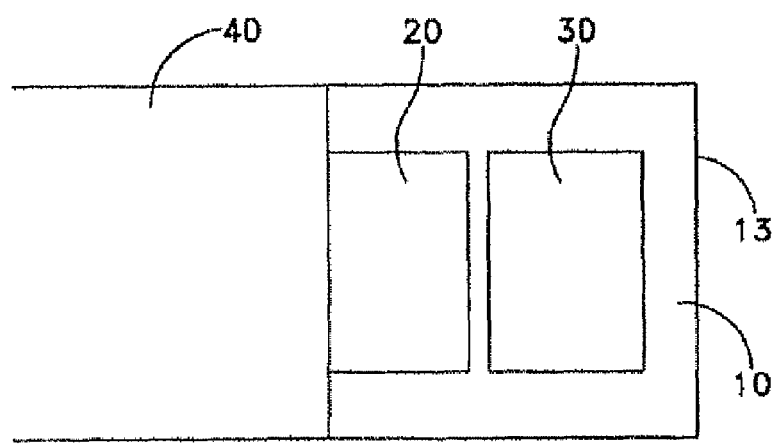
FIGS. 2A-2C are corresponding plan views of the liquid crystal display panel illustrated in respective FIGS. 1A-1C.

FIGS. 1A-1C and 2A-2C collectively illustrate an embodiment of the ACF bonding method. FIG. 1A illustrates an LCD panel 10 of a LCD device that will have a driver IC chip and a FPC board ACF bonded to a surface of the panel 10 using a single, unitary ACF. The panel 10 may be made from glass or quartz substrate and includes a pixel region 111 and a peripheral region 12. The pixel region 11 includes a pixel thin film transistor (TFT) array and electrically conductive gate and data lines connected to the TFT array. The design of the pixel TFT array and the gate and data lines is well known to persons of ordinary skill in the art and need not be described further herein. A color filter substrate 40 may also be provided over the pixel region 11. A first array 20 of electrically conductive electrodes, which terminate the gate or data lines that extend from the pixel region 11 to electrically connect the driver IC chip with the TFT array, is disposed on the surface of the LCD panel 10 in the peripheral region 12, remote from an edge 13 of the panel 10. A second array 30 of electrically conductive electrodes, for electrically connecting the FPC board with the driver IC chip, is disposed on the surface of the panel LCD 10, in the peripheral region 12 adjacent the edge 13 of the panel 10.

Figure 1B:
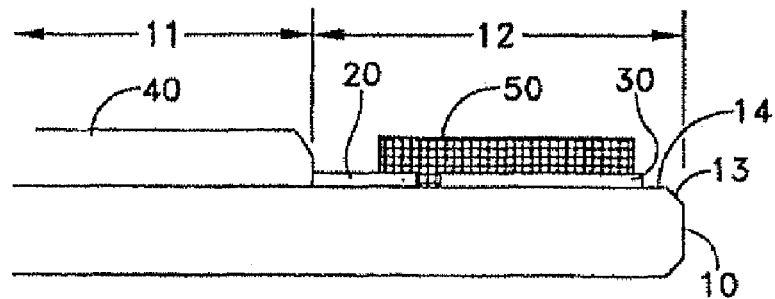
Figure 2B:
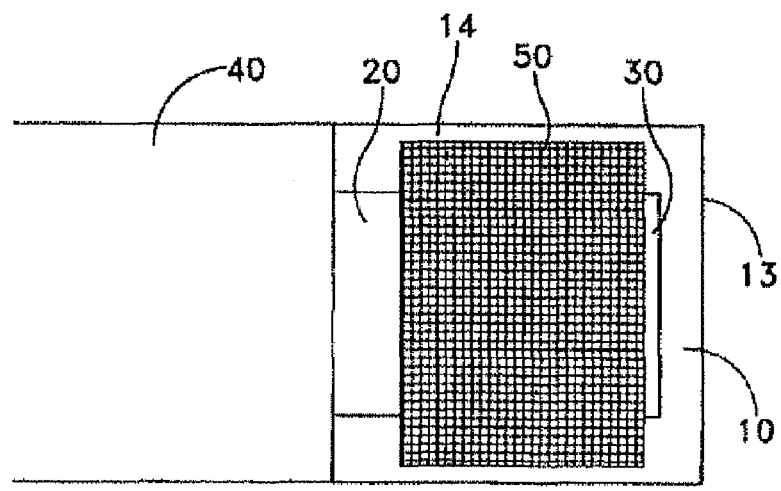

As illustrated in FIGS. 1B and 2B, a single, unitary ACF 50 is adhered to a surface 14 of the panel 10 in the peripheral region 12 thereof and positioned such that it covers connecting terminal portions of the electrode arrays 20 and 30. The ACF 50 has a length and a width that are sufficient for covering the connecting terminal portions of both electrode arrays 20 and 30.

Figure 1C:
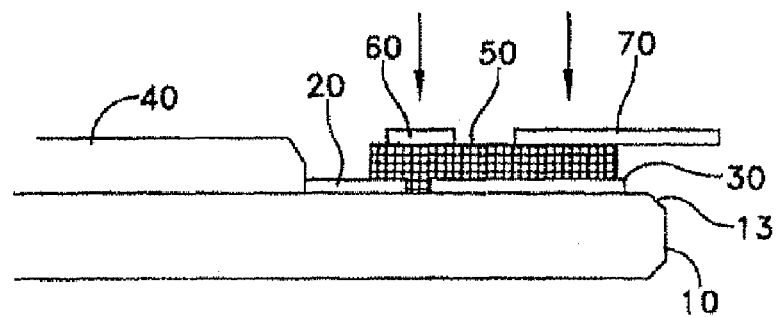
Figure 2C:
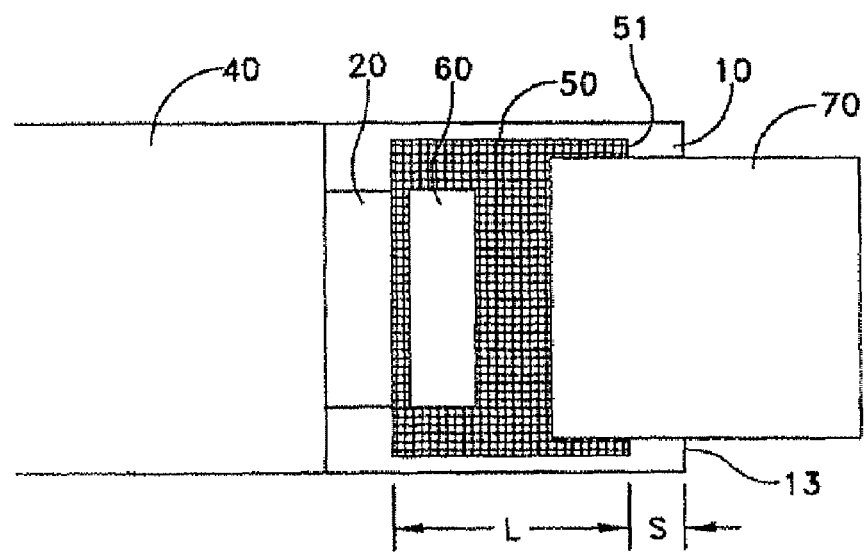

As illustrated in FIGS. 1C and 2C, a driver IC chip 60 and an end section of an FPC board 70 are placed on the ACF 50. The IC chip 60 may be positioned on the ACF 50 such that electrically conductive electrode bumps disposed on the bottom surface of the chip vertically align with corresponding terminal portions of both electrode arrays 20 and 30 on the surface 14 of the LCD panel 10, underneath the ACF 50. The driver IC chip 60 is then compressed with the LCD panel 10. The end section of the FPC board 70 is then positioned on the ACF 50 such that electrically conductive terminal leads disposed on the bottom surface of the FPC board vertically align with corresponding terminal portions of the electrode array 30 on the surface 14 of the LCD panel 10, underneath the ACF 50. The FPC board 70 is then compressed with the LCD panel 10. In an alternative embodiment, the FPC board 70 may be positioned on the ACF 50 first and compressed with the LCD panel 10, followed by the positioning of the IC chip 60 on the ACF 50 and the compressing of the IC chip 60 with the LCD panel 10. It is also contemplated that the IC chip 60 and the FPC board 70 may be compressed at the same time with the LCD panel 10 in a single compressing operation, after they have been placed on the ACF 50. In any case, the assembly is heated to approximately 120° C. to cure the ACF 50 so that the IC chip 60 and FPC board 70 adhere to the LCD panel 10. As is well known in the art, the ACF 50 comprises a plurality of conductive spheres dispersed in an adhesive resin. The adhesive resin in the ACF 50 adhesively bonds the driver IC chip 60 and the end section of the FPC board 70 to the LCD panel 10 and the conductive spheres in the ACF 50 electrically connects the electrode bumps of the IC chip 60 and the terminal leads of the FPC board with their respective terminal portions of electrode arrays 20 and 30. The conductive spheres of the ACF 50 that are located between the vertically aligned terminal portions of electrode arrays 20 and 30 and the bumps and terminal leads of the IC chip 60 and FPC board 70 are subjected to compressive forces during the compression. The compressive force ruptures a thin, electrically insulating membrane which covers each of the spheres, thus, allowing those spheres to electrically connect the vertically aligned terminal portions of the electrode arrays 20 and 30 and bumps and terminal leads of the IC chip 60 and FPC board 70. Adjacent vertically aligned IC chip bumps/FPC board leads and electrode array terminal portions remain electrically isolated from one another as the spheres located therebetween have not been compressed and remain electrically insulated from one another by their intact insulating membranes.

As illustrated in FIG. 2C, the ACF 50 may have a length L that allows far edge 51 of the ACF 50 to be spaced from the edge 13 of the LCD panel 10 by a distance S.

Figure 3A:
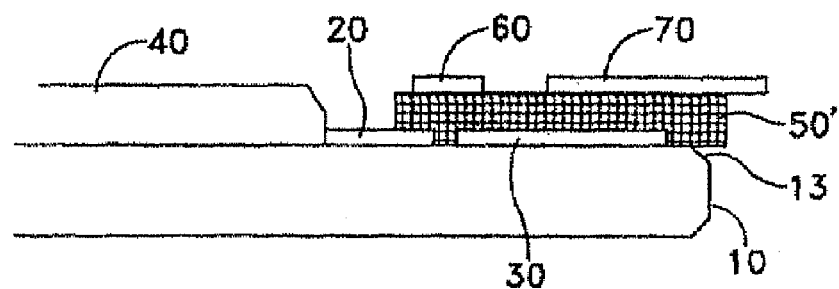
FIG. 3A is a side elevational view of a section of a liquid crystal display panel illustrating an alternate embodiment of the method of the invention.
Figure 3B:
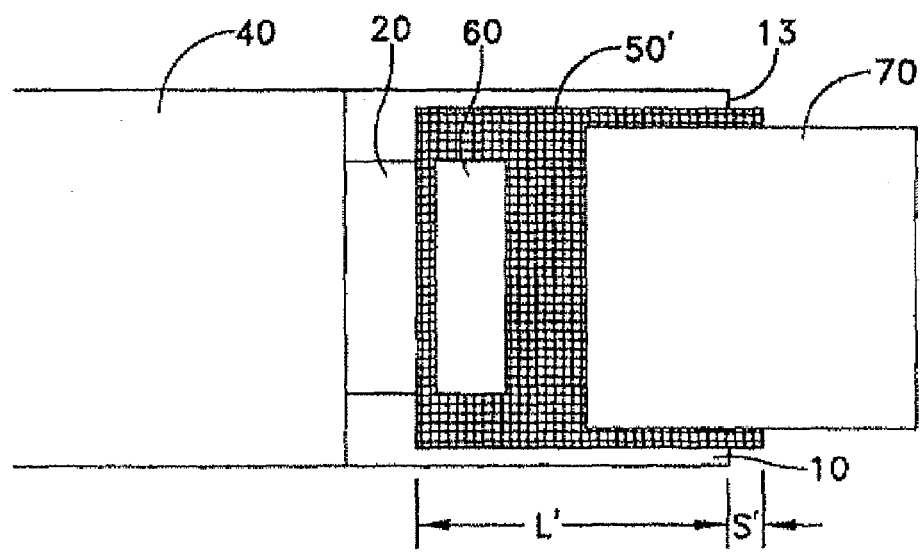
FIG. 3B is a corresponding plan view of the liquid crystal display panel illustrated in FIG. 3A.

In an alternate embodiment, as illustrated in FIGS. 3A and 3B, the ACF, denoted by numeral 50', may have a length L' that allows far edge 51' of the ACF 50' to extend over the edge 13 of the LCD panel 10 by a distance S' in order to improve the FPC peeling strength.

Figure 4:
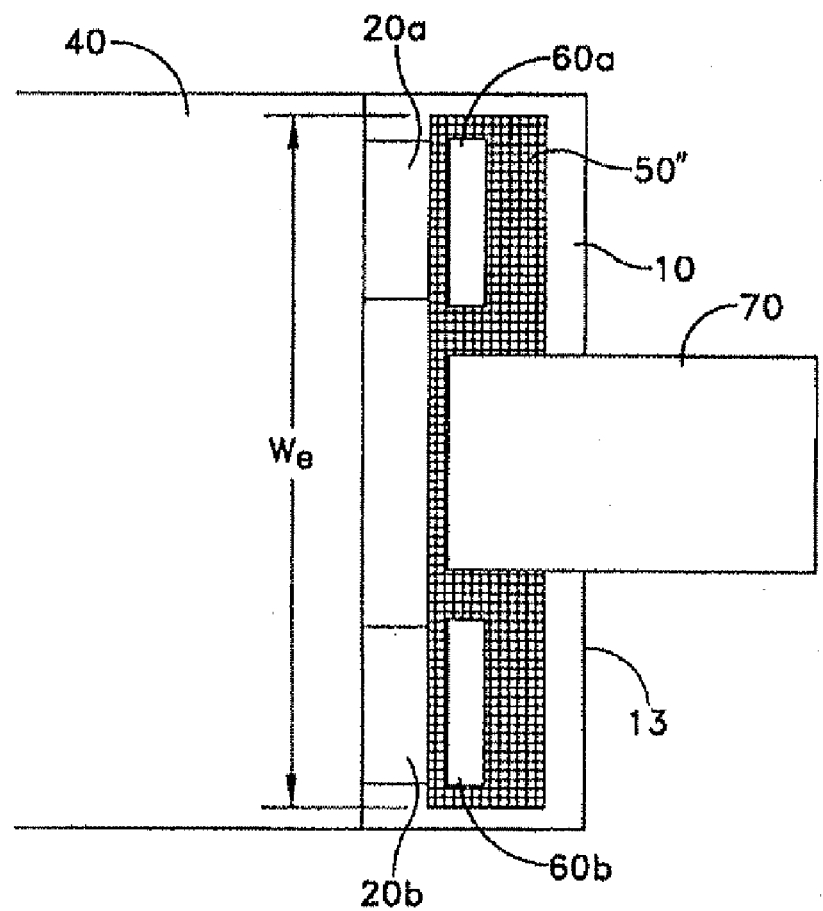
FIG. 4 is a plan view of a section of a liquid crystal display panel illustrating a further embodiment of the method of the invention.
Figure 5:
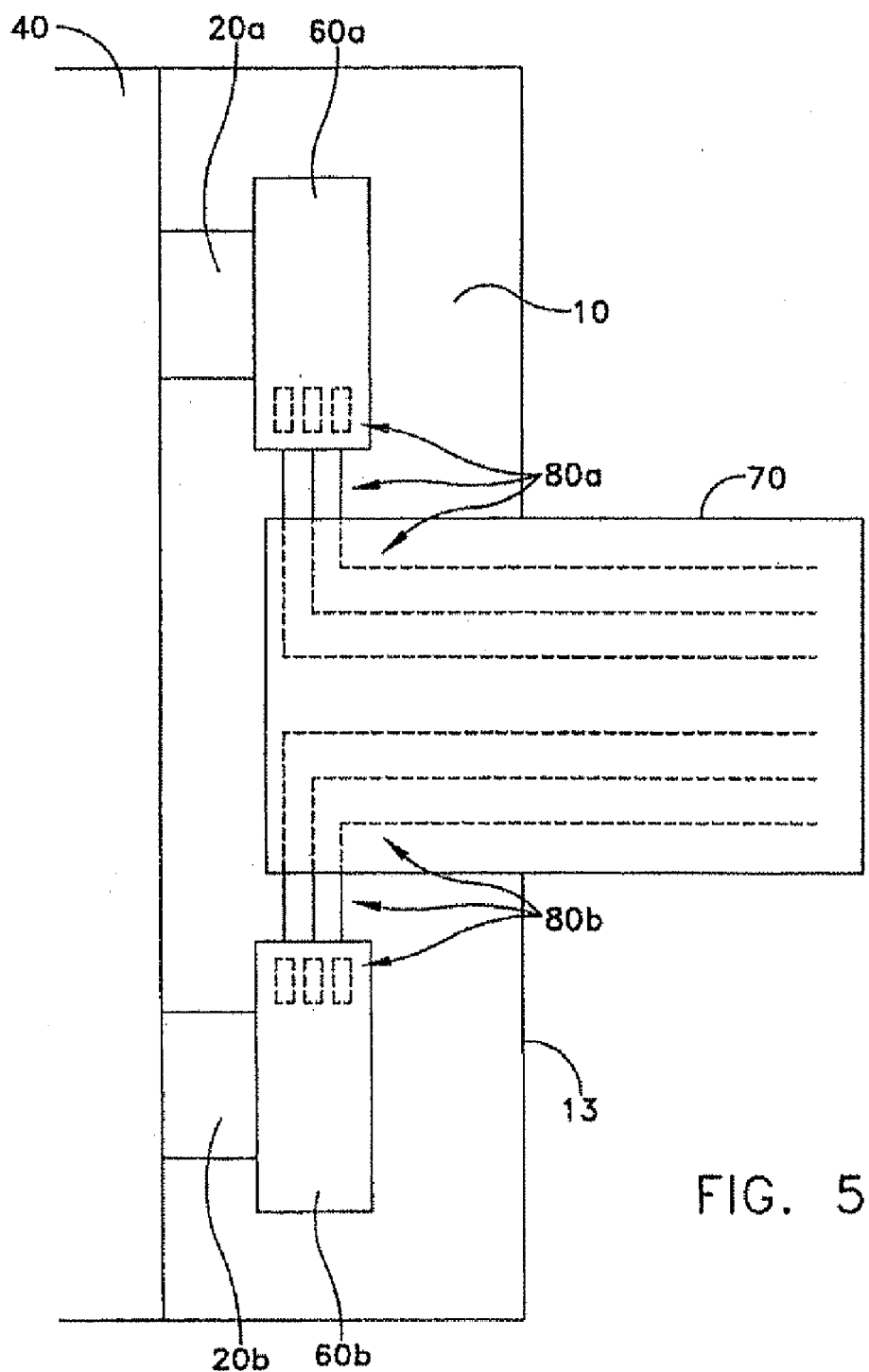
FIG. 5 is a plan view of the liquid crystal display panel of FIG. 4 shown without the ACF to illustrate IC-to-FPC electrode arrays.

In a further embodiment as illustrated in FIG. 4, the peripheral region 12 of the LCD panel 10 includes two arrays 20a and 20b of electrically conductive electrodes and two respective driver IC chips 20a and 20b. The ACF, denoted by numeral 50", may be configured to ACF bond both driver IC chips 20a and 20b and FPC board 70. This may be accomplished by providing the ACF 50" with an extended width $W_e$ that is sufficient for ACF bonding both IC chips 20a and 20b to electrode arrays 20a and 20b, and FPC board 70 to IC-to-FPC electrode arrays 80a and 80b, as shown in FIG. 5.

While the foregoing invention has been described with reference to the above, various modifications and changes can be made without departing from the spirit of the invention. Accordingly, all such modifications and changes are considered to be within the scope of the appended claims.

What is claimed is:

1. A liquid crystal display device comprising:
   a panel;
   a thin film transistor array disposed on a first region of the panel;
   a first integrated circuit chip;
   a device selected from the group consisting of a flexible printed circuit board, a tape carrier package, and a chip-on-film; and
   an anisotropic conductive film bonding the first integrated circuit chip and the device to a second region of the panel, wherein the anisotropic conductive film extends continuously from the first integrated circuit chip to the device.

2. The liquid crystal display device according to claim 1, wherein the second region of the panel comprises a peripheral region.

3. The liquid crystal display device according to claim 1, wherein the first integrated circuit chip comprises a first driver integrated circuit chip.

4. The liquid crystal display device according to claim 1, wherein the anisotropic conductive film is spaced from an edge of the panel.

5. The liquid crystal display device according to claim 1, wherein the anisotropic conductive film extends beyond an edge of the panel.

6. The liquid crystal display device according to claim 1, further comprising a second integrated circuit chip, the anisotropic conductive film bonding the first and second integrated circuit chips and the device to the second region of the panel.

* * * * *